(12) United States Patent
Schlaffer et al.

(10) Patent No.: US 11,612,064 B2
(45) Date of Patent: Mar. 21, 2023

(54) COMPONENT CARRIER WITH A SOLID BODY PROTECTING A COMPONENT CARRIER HOLE FROM FOREIGN MATERIAL INGRESSION

(71) Applicant: AT&S Austria Technologie & Systemtechnik Aktiengesellschaft, Leoben (AT)

(72) Inventors: Erich Schlaffer, St. Lorenzen (AT); Markus Steinkellner, St. Margarethen (AT)

(73) Assignee: AT&S Austria Technologie & Systemtechnik AG, Leoben (AT)

( * ) Notice: Subject to any disclaimer, the term of this patent is extended or adjusted under 35 U.S.C. 154(b) by 0 days.

(21) Appl. No.: 17/302,599

(22) Filed: May 7, 2021

(65) Prior Publication Data
US 2021/0360795 A1 Nov. 18, 2021

(30) Foreign Application Priority Data
May 12, 2020 (EP) .................................. 20174070

(51) Int. Cl.
*H05K 1/03* (2006.01)
*H05K 3/00* (2006.01)
(Continued)

(52) U.S. Cl.
CPC ........... *H05K 3/3431* (2013.01); *H05K 3/429* (2013.01); *H05K 3/0047* (2013.01)

(58) Field of Classification Search
CPC ........ H05K 1/03; H05K 1/0306; H05K 1/183; H05K 3/00; H05K 3/067; H05K 3/0094;
(Continued)

(56) References Cited

U.S. PATENT DOCUMENTS 5,490,965 A * 2/1996 Christiansen ......... C04B 35/653
264/237
5,559,443 A * 9/1996 Yokoya .............. G01R 1/07378
324/755.05
(Continued)

FOREIGN PATENT DOCUMENTS

CN 1243601 A 2/2000
CN 1613158 A 5/2005
(Continued)

OTHER PUBLICATIONS

Kelly, D.; Extended European Search Report in Application No. EP 20 17 4070.1; pp. 1-7; dated Nov. 6, 2020; European Patent Office; 80298, Munich, Germany.
(Continued)

*Primary Examiner* — Xiaoliang Chen
(74) *Attorney, Agent, or Firm* — Robert A. Blaha; Smith Tempel Blaha LLC (57) ABSTRACT

A component carrier includes (a) a first stack with at least one first electrically conductive layer structure and/or at least one first electrically insulating layer structure; (b) a hole formed within the first stack; and (c) a non-deformable solid body closing a portion of the hole and being spaced with respect to side walls of the hole by a gap. A component carrier assembly includes (a) a component carrier as described above; (b) a second stack having at least one second electrically conductive layer structure and/or at least one second electrically insulating layer structure; and (c) a connection piece connecting the first stack with the second stack. Further described are methods for manufacturing such a component carrier and such a component carrier assembly.

19 Claims, 2 Drawing Sheets

(51) Int. Cl.
*H01L 21/67* (2006.01)
*H01L 21/70* (2006.01)
*H01L 21/768* (2006.01)
*H01L 23/12* (2006.01)
*H01L 23/498* (2006.01)
*H05K 3/34* (2006.01)
*H05K 3/42* (2006.01)

(58) Field of Classification Search
CPC ........ H05K 3/108; H05K 3/384; H05K 3/385; H05K 3/388; H05K 3/4061; H05K 2201/0129; H05K 2201/0158; H05K 2201/09981; H05K 2201/10515; H05K 2203/072; H05K 2203/0307; H01L 21/67; H01L 21/70; H01L 21/768; H01L 21/76807; H01L 21/76844; H01L 21/78655; H01L 21/76885; H01L 21/76886; H01L 23/12; H01L 23/498; H01L 23/642
USPC ....... 174/250, 255, 256; 257/21.577, 21.591, 257/169, 586, 700, 701; 324/756.06; 438/635, 637, 660
See application file for complete search history.

(56) References Cited

U.S. PATENT DOCUMENTS

| | | | |
|---|---|---|---|
| 5,723,367 A * | 3/1998 | Wada | C23C 14/5833 204/192.15 |
| 5,764,485 A | 6/1998 | Lebaschi | |
| 6,071,810 A * | 6/2000 | Wada | H01L 21/76886 257/E21.585 |
| 6,270,002 B1 * | 8/2001 | Hayashi | H01L 24/11 228/2.1 |
| 6,477,052 B1 | 11/2002 | Barcley | |
| 6,826,830 B2 | 12/2004 | Egitto et al. | |
| 6,952,049 B1 * | 10/2005 | Ogawa | H01L 23/642 257/700 |
| 7,535,095 B1 * | 5/2009 | En | H05K 3/388 257/762 |
| 2009/0053459 A1 | 2/2009 | Hirose et al. | |
| 2013/0025919 A1 | 1/2013 | Lau | |
| 2015/0270205 A1 | 9/2015 | Tollafield | |
| 2018/0111126 A1 | 4/2018 | Osmus et al. | |
| 2019/0021172 A1 | 1/2019 | Kuczynski | |

FOREIGN PATENT DOCUMENTS

| | | |
|---|---|---|
| CN | 1647324 A | 7/2005 |
| CN | 104299945 A | 1/2015 |
| CN | 105848456 A | 8/2016 |
| CN | 107006126 A | 8/2017 |
| CN | 110634805 A | 12/2019 |
| DE | 102018201585 A1 | 8/2018 |
| EP | 0715355 A2 | 6/1996 |
| EP | 3582593 A1 | 12/2019 |
| JP | H03101194 A | 4/1991 |
| JP | 2561948 B2 | 12/1996 |
| JP | 2003133771 A | 5/2003 |
| JP | 2018125515 A | 8/2018 |
| WO | 03088424 A1 | 10/2003 |
| WO | 2010019820 A1 | 2/2010 |

OTHER PUBLICATIONS

First Office Action in Application No. 202110513304.8; China National Intellectual Property Administration; English Translation of Cover pages, pp. 1-3; dated Jul. 29, 2022; No. 6, Xitucheng Lu, Jimenqiao Haidian District, Beijing City, 100088, China.

* cited by examiner

COMPONENT CARRIER WITH A SOLID BODY PROTECTING A COMPONENT CARRIER HOLE FROM FOREIGN MATERIAL INGRESSION

CROSS-REFERENCE TO RELATED APPLICATION

The present application claims the benefit of the filing date of the European Patent Application No. 20174070.1, filed May 12, 2020, the disclosure of which is hereby incorporated herein by reference.

TECHNICAL FIELD

Embodiments of the invention relate to a component carrier and a method of manufacturing the component carrier. More specifically, embodiments of the present invention relate to (constituents of) stacked component carriers and methods for fabricating (constituents of) stacked component carriers.

TECHNOLOGICAL BACKGROUND

Component carriers or Printed Circuit Boards (PCB) are regularly used as a support for building up electronic assemblies comprising one or more electronic components being electrically connected with each other in such a manner that an electrically operational module is formed. Thereby, a component carrier comprises conductor paths on its top or bottom surface in order to provide the necessary electric wiring between the components. In a so-called Multilayer PCB there are even conductor paths formed in the interior of the PCB in between different neighboring electrically insulating PCB layer structures.

For some applications it is necessary or at least of advantage to build up electronic assemblies with a component or components which are arranged on and/or within a component carrier assembly wherein a first component carrier and a second component carrier are formed or arranged over each other in a so called z-direction being perpendicular to the main surfaces of the first and second component carrier. Such component carrier assemblies are also called stacked component carriers or component carrier stacks. Compared to a single Multilayer component carrier having, due to process constraints, a limited number of layer structures, a component carrier stack may comprise a higher number of layer structures, which may be necessary in particular for High Frequency (HF) applications or for applications wherein different physical properties of the final PCB are needed in different (height) regions. Such varying physical properties, which may depend on the specific design and/or the complexities of at least some layer structures, may be for instance mechanical properties such as e.g. the Young's modulus, the Coefficient of Thermal Expansion (CTE), the dielectric constant of electrically insulating layers, etc.

A component carrier stack is typically fabricated by laminating two component carriers together with an uncured prepreg layer being sandwiched in between the two already cured component carriers. In accordance with common PCB technology such a laminating procedure typically comprises applying a pressing force and/or heat in order to cure also the so far uncured prepreg.

When laminating two component carriers wherein at least one of these component carriers comprises a hole or via, in particular a through hole, resin material of the uncured prepreg may penetrate into the hole. This may complicate a further PCB processing of the hole and/or may deteriorate the hole for being used as a (conductive) recess into which pins of an electric connector are to be inserted.

SUMMARY

There may be a need for improving a connection (procedure) between two component carriers which allows for a protection of holes formed within at least one of the two component carriers.

This need may be met by the subject matter according to the independent claims. Advantageous embodiments are described by the dependent claims.

According to a first embodiment there is provided a component carrier comprising (a) a first stack comprising at least one first electrically conductive layer structure and/or at least one first electrically insulating layer structure; (b) a hole formed within the first stack; and (c) a non-deformable solid body closing a portion of the hole and being spaced with respect to side walls of the hole by a gap.

In a second embodiment, an assembly is provided with a component carrier arranged as above with a second stack including at least one second electrically conductive layer structure and/or at least one second electrically insulating layer structure and a connection piece connecting the first stack with the second stack.

A third embodiment includes a method for manufacturing a component carrier including forming a first stack comprising at least one first electrically conductive layer structure and/or at least one first electrically insulating layer structure; forming a hole within the first stack; and closing at least a portion of the hole by inserting a non-deformable solid body in the hole, wherein the non-deformable solid body is spaced with respect to side walls of the hole by a gap.

Another embodiment includes a method for manufacturing a component carrier assembly including performing the steps for manufacturing a component carrier as described above; forming a second stack comprising at least one second electrically conductive layer structure and/or at least one second electrically insulating layer structure; and connecting the first stack with the second stack.

Overview of Embodiments

The described component carrier is based on the idea that a non-deformable solid body can be used to close or seal a hole or via (from one side) formed within the first stack of the component carrier. This has the effect that (at least from the one side) it is not possible that unwanted penetrations or intrusions can enter the interior of the hole. As a consequence, the hole will stay clean and a further processing of the hole will not be hindered or complicated due to unwanted material which has entered the hole.

The described non-deformable solid body may prevent for instance resin from entering the hole during a lamination procedure by means of which a resin or prepreg layer is formed or attached to the described first stack. Thereby, such a resin may have an origin from the not yet (completely) cured resin or prepreg layer.

The mentioned resin or prepreg layer may form at least a part of a build-up structure for the described first stack. Alternatively, or in combination, the resin or prepreg layer may represent a connection layer structure for connecting the first stack with an already prefabricated second stack comprising at least one second electrically conductive layer structure and/or at least one second electrically insulating layer structure.

In the context of this document, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

The component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In the context of this document the term "non-deformable" may particularly refer to the ability of a body to change its size or stress in response to a force or a pressure acting on the body. The corresponding physical quantity may be given by the Young Modulus. In the described component carrier, the Young Modulus of the non-deformable solid body has a value being at least so high that during a lamination procedure with the described component carrier the size and the shape of the non-deformable solid body remains (substantially) unchanged. This may mean that the absolute value of the Young Modulus of the non-deformable solid body is larger than the Young Modulus of the (so far uncured) resin which, together with the described first stack, is involved in a lamination procedure. Preferably, the Young Modulus of the non-deformable solid body is larger or at least the same as the Young Modulus of other materials of the first stack.

It is pointed out that the non-deformable solid body may have any shape which is suitable for closing the described hole portion. Apart from a ball shape, which is described in further detail below, the non-deformable solid body may have for instance the shape of a (truncated) cone. For closing the hole portion, the (truncated) cone shaped body may be inserted into the hole portion having a smaller diameter in such a manner that the slimmer end portion of the (truncated) cone shaped body is inserted into this smaller hole portion at least partially.

In preferred applications, the Young Modulus of the non-deformable solid body is larger than 15 GPa, preferably larger than 20 GPa, and more preferably larger than 25 GPa. It mentioned that the described Young Modulus of the non-deformable solid body may correspond to an Elastic Modulus (Young modulus) of dielectric materials which are often used in PCB and substrate technologies.

In most embodiments, the hole extends along a direction which is perpendicular to the main surface(s) of the layer(s). This direction is usually denominated z-direction. However, in some applications the longitudinal axis of the hole is angular or inclined with respect to the normal direction of the main surface(s) of the layer(s) of the first stack.

According to an embodiment the non-deformable solid body is a ball. Using an at least approximately ball shaped non-deformable solid body may provide two advantages which are typically independent from each other. A first advantage may be that typically ball shaped articles can be produced comparatively easy. The second advantage may be that due to its everywhere curved surface the ball shaped non-deformable solid body will automatically align with the hole when placing the ball shaped non-deformable solid body on the hole. This holds true for all hole geometries wherein at least a portion of the hole has a diameter which is smaller than the diameter of the ball shaped non-deformable solid body.

According to a further embodiment the non-deformable solid body comprises or consists of at least one of the group consisting of (i) glass, (ii) (cured) resin, and (iii) copper. Using any one or a combination of the described materials may provide the advantage that the process for manufacturing the described component carrier can be realized within existing and well approved standard PCB technologies.

(i) A non-deformable solid body made from or comprising glass may be realized for instance by pieces of fragments of glass fibers. Such pieces or fragments may originate from glass fibers which are comprised in at least one glass fibers enforced prepreg layer of the first stack.

(ii) A non-deformable solid body made from or comprising (cured) resin may provide the advantage that it comprises a Coefficient of Thermal Expansion (CTE) which is at least very similar to the CTE of a resin prepreg. Hence, when the hole to be sealed is formed within such a prepreg a reliable seal can be guaranteed also for varying temperatures. This may be relevant for instance for a heat assisted lamination procedure wherein a prepreg layer is laminated (as a connection piece) on top of the first stack.

(iii) A non-deformable solid body made from or comprising copper may be used in particular when the non-deformable solid body seals the hole at a (vertical) z-position in which there is located a copper layer. This means that the copper non-deformable solid body, which comprises a (slightly) larger diameter than the corresponding hole opening within the copper layer, is in mechanical contact with the copper layer. Hence, also in this case there is no difference in the CTE between the non-deformable solid body and the relevant portion of the hole such that a reliable seal can be guaranteed also for time dependent temperature variations.

According to a further embodiment, the component carrier further comprises a fixing medium located at least partially within the hole. Thereby, the fixing medium is in contact with the non-deformable solid body.

A fixing medium may be used to hold the non-deformable solid body in place. Hence, an unwanted opening of the hole, which may take place in further processing steps of the described component carrier, can be avoided. In other words, the described fixing medium may make the sealing of the hole more reliable.

The fixing medium may be located above and/or below the non-deformable solid body. Fixing medium below the non-deformable solid body is typically inserted into the hole before the non-deformable solid body is placed in its position. Fixing medium above the non-deformable solid body is typically inserted into the hole after the non-deformable solid body is placed in its position.

According to a further embodiment, the fixing medium comprises or consists of a curable or cured (plug) paste, in particular a paste being curable by ultraviolet radiation.

In this context the term "paste" may refer to any viscous medium which can be applied, e.g., by means of a dispensing procedure, on, at or within the hole. The paste may exhibit a certain degree of adhesiveness which may facilitate holding the non-deformable solid body in place even before an (optional) ultraviolet (UV) radiation is used for curing the fixing medium. The fixing medium may be, e.g., a (not yet cured) resin.

According to a further embodiment at least a portion of the hole comprises an electrically conductive inner side wall. This may mean that the described sealing technique can also be realized for through hole vias and/or for blind hole vias. Such (vertical) interconnect structures are widely used in multilayer PCBs such that the described sealing technique can be applied for many applications, in particular for multilayer PCBs being used for High Frequency (HF) applications.

According to a further embodiment, the component carrier further comprises an electric connector, wherein the electrically conductive inner side wall is electrically contacted with a contact terminal of the connector.

Sealing the hole interior from unwanted penetrations or intrusions may improve the quality of the electric contact between the electrically conductive inner side wall and the contact terminal. This may result in a small transition resistance and/or in a high stability of the electric contact for instance even under varying operating temperatures.

The described connected can be for instance a so called SERDES (Serializer/Deserializer) connector which can be used for instance for HF applications. Since such a connector comprises several connector terminals, the described component carrier typically comprises at least one further hole and at least one further non-deformable solid body. Thereby, each one of the non-deformable solid bodies seal one of the at least one further hole.

According to a further embodiment, the hole has a first hole portion and a second hole portion being directly connected to each other. Thereby, the first hole portion has a first diameter larger than a diameter of the non-deformable solid body and the second hole portion has a second diameter smaller than the diameter of the non-deformable solid body.

In this embodiment the non-deformable solid body may particularly be inserted within the first hole portion. Alternatively, or in combination, the non-deformable solid body may rest on a spatial transition between the first hole portion and the second hole portion. The spatial transition may be a (more or less) sharp ledge or a step, wherein the non-deformable solid body rests on this ledge/step and provides the desired sealing of the second hole portion.

The first hole portion may be denominated a recess formed over the second hole portion. Although a circular cross section (in a plane being perpendicular to the longitudinal axis of the hole) is preferred, in most applications, the recess or first hole portion may have any other cross section such as an elliptic or rectangular cross section.

The wider first hole portion may be formed for instance with a so called back-drill procedure. Thereby, first a hole with a smaller second diameter is formed (as a through hole or as a blind hole) and second solely the first hole portion is formed with the wider first diameter and with a length being shorter than the length of the previously formed hole with the second diameter.

It is mentioned that the Back-drill technology per se is known for manufacturing multilayer PCBs and in particular multilayer PCBs where two or more sub-PCBs are connected with each other along the z-axis. Typically, back drilling is used to reduce the length of plated through holes (PTH) in particular for component carriers used for High Speed & Radio Frequency Applications. In the described component carrier, it is avoided by means of the non-deformable solid body that during a re-lamination procedure resin flows into the smaller second portion of a back-drilled PTH such that a connector could not be assembled anymore.

Although back-drilling is usually realized with mechanical drills or drill bits also laser drilling can be employed in order to form an appropriately sized first hole portion and/or second hole portion.

According to a further embodiment, the component carrier further comprises at least one further hole formed in the first stack and at least one further non-deformable solid body closing a portion of the at least one further hole and being spaced with respect to side walls of the at least one further hole by a gap.

In case there are two or more further holes (and two or more further non-deformable solid bodies) each one of the two or more further non-deformable solid bodies is assigned to exactly one of the two or more further holes (and vice versa).

A component carrier with, in addition to the above-mentioned hole and the above-mentioned non-deformable solid body, at least one further hole and a corresponding number of further non-deformable solid bodies allows for "keeping clean" two or more holes which can be used for (inserting) respective (i.e., one) contact terminals of an electric connector. Thereby, as has already been mentioned above, a clean hole with metallized sidewalls allows for realizing (i) an electrically low resistance and (ii) a mechanically and electrically reliable contact between (metallized sidewalls of) the hole and the corresponding contact terminals.

According to a further embodiment, the non-deformable solid body comprises a first spatial dimension and at least one of the at least one further non-deformable solid body comprises a second spatial dimension being different from the first spatial dimension. This may allow to seal holes having different sizes and (respectively) different cross sections with respect to each other.

According to a further aspect there is provided a component carrier assembly comprising (a) a component carrier as described above; (b) a second stack comprising at least one second electrically conductive layer structure and/or at least one second electrically insulating layer structure; and (c) a connection piece connecting the first stack with the second stack.

The described component carrier assembly is based on the idea that a component carrier the above-described component carrier (with at least one sealed hole) may be used as a core structure which can be extended with the second stack representing a so-called build-up layer structure. Thereby, the connections piece, which may be made or which may comprise a resin or a prepreg layer, mechanically connects the component carrier comprising the first stack with the second stack.

According to a further aspect there is provided a method for manufacturing a component carrier. The provided method comprises (a) forming a first stack comprising at least one first electrically conductive layer structure and/or at least one first electrically insulating layer structure; (b) forming a hole within the first stack; and (c) closing at least a portion of the hole by inserting a non-deformable solid body in the hole, wherein the non-deformable solid body is spaced with respect to side walls of the hole by a gap.

Also, the described method is based on the idea that a non-deformable solid body can be used to close or seal a hole or via formed within the first stack of the component carrier. This has the effect that (at least from one side) it is not possible anymore that unwanted (resin) material can enter the interior of the hole for instance during a re-lamination procedure wherein the first stack is connected with at least a resin layer, in particular an uncured prepreg layer.

According to a further embodiment the method further comprises (a) forming a further hole within the first stack; and (b) closing at least a portion of the further hole by inserting a further non-deformable solid body in the further hole. Thereby, the further non-deformable solid body is spaced with respect to side walls of the further hole by a gap.

As has already been mentioned above, forming two (or more) holes and closing them by means of respective (i.e., one) non-deformable solid bodies may allow for electrically connecting two (or more) contact terminals of an electric connector to the component carrier, e.g., a so called SERDES connector.

It is mentioned that in preferred manufacturing methods the hole and the (at least one) further hole are formed simultaneously and later the non-deformable solid body and the at least one further non-deformable solid body are inserted within or are placed on a top opening of the respective hole.

According to a further embodiment forming the first stack is carried out on a tape and the method further comprises (a) forming, next to the first stack, an additional first stack on the tape, the additional first stack comprising at least one additional first electrically conductive layer structure and/or at least one additional first electrically insulating layer structure; (b) forming an additional hole within the additional first stack; and (c) closing at least a portion of the additional hole by inserting an additional non-deformable solid body in the additional hole, wherein the additional non-deformable solid body is spaced with respect to side walls of the additional hole by a gap.

Descriptively speaking, a plurality of the above-described component carriers may be formed in an effective manner by employing a so-called tape and reel configuration. Thereby, a tape (having a certain adhesiveness) may be supplied from a reel and the described component carriers are formed next to each other on the tape. After having manufactured the component carriers the tape together with the attached component carriers may be rolled up on the reel or on another reel. Thereby, a plurality of component carriers (as half-finished products) may be stored in a compact manner. Further, the described tape and reel configuration may provide the advantage that for later build up procedures the prefabricated component carriers can be provided in a quick, easy and reliable manner.

According to a further aspect there is provided a method for manufacturing a component carrier assembly. The provided method comprises (a) carrying out a method for manufacturing a component carrier as described above; (b) forming a second stack comprising at least one second electrically conductive layer structure and/or at least one second electrically insulating layer structure; and (c) connecting the first stack with the second stack.

The described method for manufacturing a component carrier assembly is based on the idea that a component carrier manufactured by the above-described method can be extended with the second stack representing a so-called build-up layer structure. Thereby, the second stack can be connected by means of a re-lamination procedure, if applicable with an uncured resin connection piece in between the first stack and the second stack. Thereby, unwanted (resin) intrusion into the hole can be prevented by means of the non-deformable solid body closing at least a portion of the hole.

It is mentioned that in between the first stack and the second stack there may be accommodated an embedded component. Thereby, the embedded component may be embedded within a cavity within the first stack and/or within a cavity within the second stack.

The embedded component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an optical element (for instance a lens), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In the following further considerations are presented which may be relevant at least for some embodiments.

In some embodiments, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In some embodiments, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be, in relation to a PCB, a comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Size Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photo-imageable or dry-etchable organic material like epoxy-based build-up material (such as epoxy-based build-up film) or polymer compounds like polyimide, polybenzoxazole, or benzocyclobutene-functionalized polymers.

In some embodiments, the at least one electrically insulating layer structure comprises at least one of the group consisting of resin (such as reinforced or non-reinforced resins, for instance epoxy resin or bismaleimide-triazine resin), cyanate ester resin, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up film, polytetrafluoroethylene (PTFE, Teflon®), a ceramic, and a metal oxide. Reinforcing structures such as webs, fibers or spheres, for example made of glass (multi-layer glass) may be used as well. Although prepreg particularly FR4 are usually preferred for rigid PCBs, other materials in particular epoxy-based build-up film or photo-imageable dielectric material may be used as well. For high frequency applications, high-frequency materials such as polytetrafluoroethylene, liquid crystal polymer and/or cyanate ester resins, low temperature cofired ceramics (LTCC) or other low, very low or ultra-low DK materials may be implemented in the component carrier as electrically insulating layer structure.

In some embodiments, the at least one electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

In some embodiments, the component carrier is a laminate-type component carrier. In such an embodiment, the component carrier is a compound of multiple layer structures which are stacked and connected together by applying a pressing force and/or heat. After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained. After having completed formation of a stack of electrically insulating layer structures and electrically conductive layer structures, it is possible to proceed with a surface treatment of the obtained layers structures or component carrier. In particular, an electrically insulating solder resist may be applied to one or both opposing main surfaces of the layer stack or component carrier in terms of surface treatment. For instance, it is possible to form such as solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and to enable a joining process with one or more components, for instance by soldering. Examples for appropriate materials for a surface finish are Organic Solderability Preservative (OSP), Electroless Nickel Immersion Gold (ENIG), gold (in particular Hard Gold), chemical tin, nickel-gold, nickel-palladium, ENIPIG (Electroless Nickel Immersion Palladium Immersion Gold, etc.

It has to be noted that embodiments have been described with reference to different subject matters. In particular, some embodiments have been described with reference to apparatus type claims whereas other embodiments have been described with reference to method type claims. However, a person skilled in the art will gather from the above and the following description that, unless other notified, in addition to any combination of features belonging to one type of subject matter also any combination between features relating to different subject matters, in particular between features of the apparatus type claims and features of the method type claims is considered as to be disclosed with this document.

The aspects defined above and further aspects of the disclosed technology are apparent from the examples of embodiment to be described hereinafter and are explained with reference to the examples of embodiment. The invention will be described in more detail hereinafter with reference to examples of embodiment but to which the invention is not limited.

DETAILED DESCRIPTION OF ILLUSTRATED EMBODIMENTS

The illustrations in the drawings are schematically presented. It is noted that in different figures, similar or identical elements or features are provided with the same reference signs or with reference signs, which are different from the corresponding reference signs only within the first digit. In order to avoid unnecessary repetitions, elements or features, which have already been elucidated with respect to a previously described embodiment, are not elucidated again at a later position of the description.

FIG. 1A, FIG. 1B, FIG. 1C, FIG. 1D, FIG. 1E, FIG. 1F and FIG. 1G illustrate method steps for manufacturing a component carrier assembly 160 comprising a laminate of a first stack and a second stack with an intermediate resin connection piece between the first stack and the second stack.

Figure 1A:
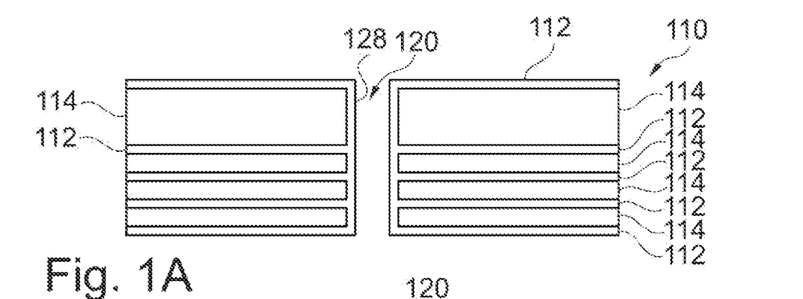
FIG. 1A, FIG. 1B, FIG. 1C, FIG. 1D, FIG. 1E, FIG. 1F and FIG. 1G illustrate method steps for manufacturing a component carrier assembly comprising a laminate of a first stack and a second stack with an intermediate resin connection piece between the first stack and the second stack.

As can be taken from FIG. 1A, the method for manufacturing a component carrier assembly starts with providing a first stack 110. The first stack 110 is a laminated (and cured) core comprising an alternating sequence of first electrically conductive layer structures 112 and first electrically insulating layer structures 114. Further, a through hole 120 is formed within the first stack 110. The through hole 120 has been plated by means of a known plating procedure such that the hole 120 comprises an electrically conductive inner side wall 128.

It is mentioned that in most applications the first stack 110 comprises more than one hole 120. However, for the sake of clarity of illustration only one hole 120 is depicted in the drawings.

Figure 1B:
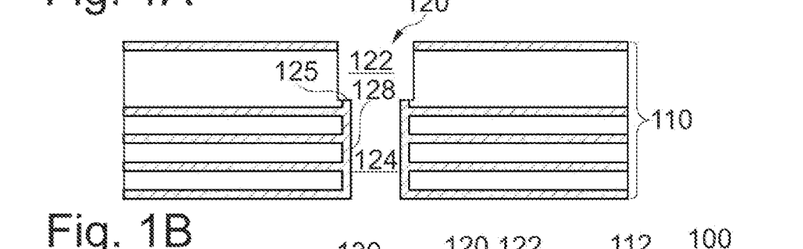

As can be taken from FIG. 1B, in a next step an upper first hole portion 122 of the hole 120 is widened by means of a so called back-drilling. This means that a drill with a slightly larger diameter is used for widening the first hole portion 122. A lower second hole portion 124 is not drilled because the wider drill is not inserted completely within the hole 120 along a not depicted vertical z-direction. Hence, the diameter of the lower second hole portion 124 is the (original) diameter of the hole 120 as depicted in FIG. 1A. Due to the two different diameters a step or a ledge 125 is formed in the transition region between the first hole portion 122 and the second hole portion 124.

It is mentioned that the described back-drilling can also be realized by means of an appropriate laser drilling. Thereby, the necessary larger diameter of a laser beam can be set by means of a proper de-focusing.

Figure 1C:
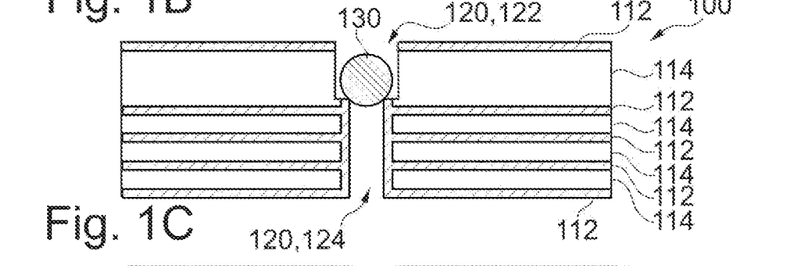

As can be taken from FIG. 1C, in a next step a non-deformable solid body 130 is inserted into the upper first hole portion 122. The non-deformable solid body 130, which in the depicted embodiment is a ball made from glass, has a diameter which is smaller than the diameter of the upper first hole portion 122 but larger than the diameter of the lower second hole portion 124. Hence, the glass ball 130 rests on the above-mentioned ledge 125.

According to the nomenclature of this document the structure shown in FIG. 1C including the glass ball 130 is denominated a component carrier 100.

Figure 1D:
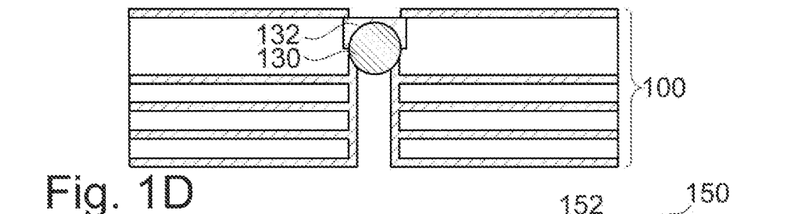

As can be taken from FIG. 1D, in a next step the glass ball 130 is fixed by means of a viscous fixing medium 132. The fixing medium may be for instance a (not yet cured) resin. In this respect it is mentioned that the presence of the fixing medium is optional. In case of a smooth handling of the component carrier 100, when performing a further processing, it may not be necessary to hold the glass ball 130 in position by means of the fixing medium 132. For instance, in other embodiments the glass ball 130 can be fixed when applying a next (prepreg) layer structure 140 (see FIG. 1E) on top of it as there might be a fixing medium from this (prepreg) layer structure 140 flowing into the gap and surrounding and holding in place the upper part of the glass ball 130.

Figure 1E:
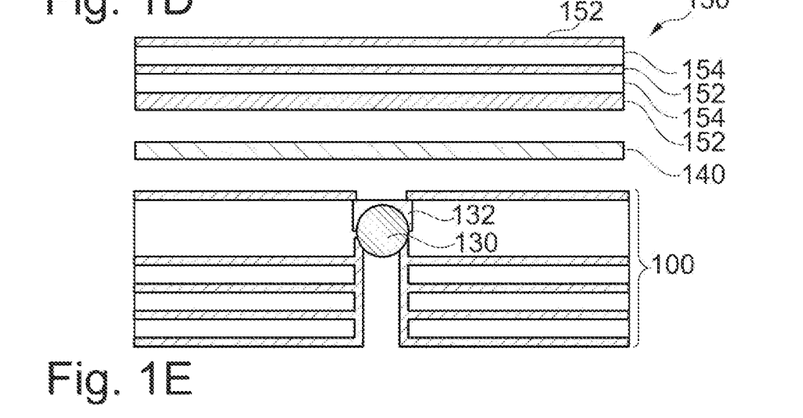

As can be taken from FIG. 1E, in a next step a later re-lamination procedure is prepared. Thereby, a connection piece 140 is arranged above the component carrier 100 and a second stack 150 is arranged above the connection piece 140.

The connection piece 140 may be a resin layer which optionally comprises reinforcement particles such as non-depicted glass fibers or glass balls (with a significantly smaller diameter than the glass ball 130). In some embodiments the connection piece 140 is a semi-finished product. Preferably, the connection piece is an at least partially uncured prepreg layer 140.

The second stack 150 is a laminated (and cured) core comprising an alternating sequence of second electrically conductive layer structures 152 and second electrically insulating layer structures 154. According to the embodiment described here the second stack 150 comprises at least one hole, a through hole and/or a blind hole which is used in a known manner for realizing an electrically conductive interconnect between different second electrically conductive layer structures 152. However, for the ease of illustration such hole(s), which are optional, are not depicted in the drawings.

Figure 1F:
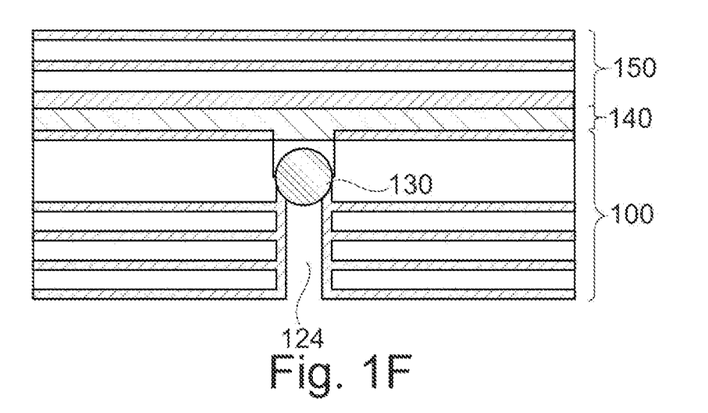

As can be taken from FIG. 1F, in a next step the re-lamination procedure already mentioned above is accomplished. According to the exemplary embodiment described here the entire arrangement of the component carrier 100, the connection piece 140, and the second stack 150 is heated up. Thereby, the resin comprised in the connection piece 140 is cured at least partially and a permanent connection between the component carrier 100 and the second stack 150 is realized.

During the re-lamination the non-deformable solid body 130 represents a barrier for viscous resin originating from the connection piece 140 and entering the lower second hole portion 124.

Figure 1G:
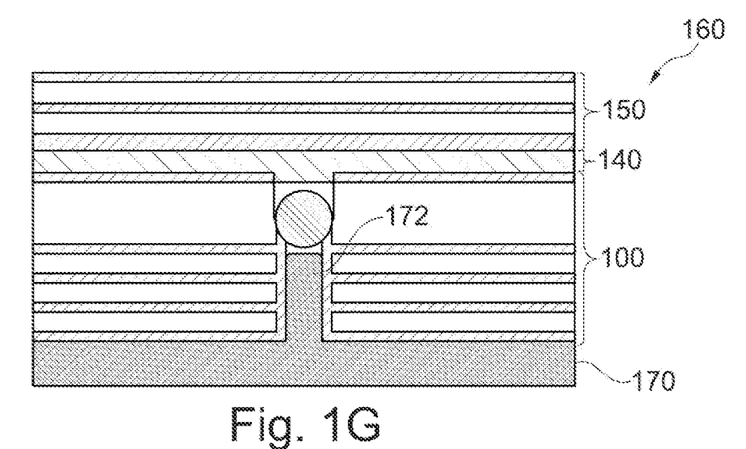

As can be taken from FIG. 1G, in a next step an electric connector 170, e.g., a SERDES connector, is attached at the component carrier 100. Thereby, a contact terminal 172 of the electric connector 170 is inserted into the second hole portion 124. Due to the above-described sealing of the second hole portion 124 by means of the non-deformable solid body 130 the second hole portion 124 is free from any (resin) intrusions. Hence, the contact terminal 172 will have a good and reliable electric contact with the electrically conductive inner side wall 128 of the second hole portion 124.

According to the nomenclature of this document the entire structure shown in FIG. 1G is denominated a component carrier assembly 160.

It is again mentioned that a typical connector comprises more than one contact terminal. However, again for the sake of clarity of illustration only the one contact terminal 172 is shown in the drawing.

Figure 2:
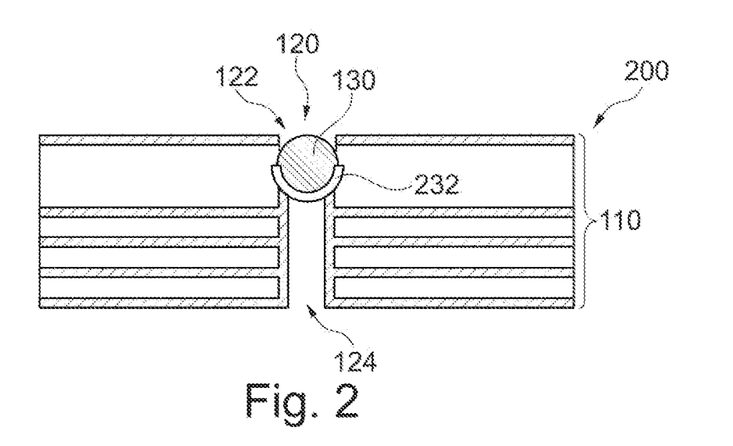
FIG. 2 shows an alternative solution for fixing a non-deformable solid body within a hole of the component carrier.

FIG. 2 shows an alternative solution for fixing the non-deformable solid body 130 within the hole of the component carrier (compare FIG. 1D). The component carrier is now designated with reference numeral 200. Again, the non-deformable solid body is formed as a glass ball 130 which rests on a step within the hole. In FIG. 2 this step, which is located at the transition between the upper first hole portion 122 and the lower second hole portion 124, is not designated with a reference numeral.

By contrast to the solution illustrated in FIG. 1D, in this embodiment the fixing medium 232 has been inserted into the upper first hole portion 122 before the glass ball 130 is inserted. Hence, the fixing medium 232 is located below the glass ball 130. According to the exemplary embodiment described here the glass ball 130 does not displace the fixing medium 232 to such an extent that it comes into direct mechanical contact with the edge of the step.

It should be noted that the term "comprising" does not exclude other elements or steps and the articles "a" or "an" do not exclude a plurality. Also, elements described in association with different embodiments may be combined.

Implementation of the invention is not limited to the preferred embodiments shown in the figures and described above. Instead, a multiplicity of variants is possible which variants use the solutions shown and the principle according to the invention even in the case of fundamentally different embodiments.

REFERENCE SIGNS

100 component carrier
110 first stack
112 first electrically conductive layer structure(s)
114 first electrically insulating layer structure(s)
120 hole
122 first hole portion
124 second hole portion
125 step/ledge
128 electrically conductive inner side wall
130 non-deformable solid body/glass ball
132 fixing medium
140 connection piece/prepreg layer
150 second stack
152 second electrically conductive layer structure(s)
154 second electrically insulating layer structure
160 component carrier assembly
170 electric connector
172 contact terminal
200 component carrier
232 fixing medium

The invention claimed is:

1. A component carrier, comprising:
   a first stack comprising at least one first electrically conductive layer structure and/or at least one first electrically insulating layer structure;
   a hole formed within the first stack, the hole comprising a first hole portion and a second hole portion; and
   a non-deformable solid body closing the second hole portion and being spaced with respect to side walls of the hole by a gap,
   wherein the second hole portion comprises an electrically conductive side wall and the first hole portion is free from an electrically conductive side wall.

2. The component carrier as set forth in claim 1, wherein the non-deformable solid body is a ball.

3. The component carrier as set forth in claim 1, wherein the non-deformable solid body comprises glass.

4. The component carrier as set forth in claim 1, wherein the non-deformable solid body comprises resin.

5. The component carrier as set forth in claim 1, wherein the non-deformable solid body comprises copper.

6. The component carrier as set forth in claim 1, further comprising:
   a fixing medium located at least partially within the hole, wherein the fixing medium is in contact with the non-deformable solid body.

7. The component carrier as set forth in claim 6, wherein the fixing medium comprises a curable or cured paste.

8. The component carrier as set forth in claim 1, wherein at least a portion of the hole comprises an electrically conductive inner side wall.

9. The component carrier as set forth in claim 8, further comprising:
   an electric connector, wherein the electrically conductive inner side wall is electrically contacted with a contact terminal of the connector.

10. The component carrier as set forth in claim 9, wherein the hole has a first hole portion and a second hole portion being directly connected to each other, and
    the first hole portion has a first diameter larger than a diameter of the non-deformable solid body and the second hole portion has a second diameter smaller than the diameter of the non-deformable solid body.

11. The component carrier as set forth in claim 1, further comprising:
    at least one further hole formed in the first stack; and
    at least one further non-deformable solid body closing a portion of the at least one further hole and being spaced with respect to side walls of the at least one further hole by a gap.

12. The component carrier as set forth in claim 11, wherein the non-deformable solid body comprises a first spatial dimension and at least one of the at least one further non-deformable solid body comprises a second spatial dimension being different from the first spatial dimension.

13. The component carrier as set forth in claim 6, wherein the fixing medium is a paste.

14. The component carrier as set forth in claim 13, wherein a characteristic of the paste changes upon being exposed to ultraviolet radiation.

15. A method for manufacturing a component carrier, the method comprising:
    forming a first stack comprising at least one first electrically conductive layer structure and/or at least one first electrically insulating layer structure;
    forming a hole within the first stack, the hole comprising a first hole portion and a second hole portion; and
    closing the second hole portion by inserting a non-deformable solid body in the hole, wherein the non-deformable solid body is spaced with respect to side walls of the hole by a gap,
    wherein the second hole portion comprises an electrically conductive side wall and the first hole portion is free from an electrically conductive side wall.

16. The method as set forth in claim 15, further comprising:
   forming a further hole within the first stack; and
   closing at least a portion of the further hole by inserting a further non-deformable solid body in the further hole, wherein the further non-deformable solid body is spaced with respect to side walls of the further hole by a gap.

17. The method as set forth in claim 15, wherein forming the first stack is carried out on a tape and wherein the method further comprises:
   forming, next to the first stack, an additional first stack on the tape, the additional first stack comprising at least one additional first electrically conductive layer structure and/or at least one additional first electrically insulating layer structure;
   forming an additional hole within the additional first stack; and
   closing at least a portion of the additional hole by inserting an additional non-deformable solid body in the additional hole, wherein the additional non-deformable solid body is spaced with respect to side walls of the additional hole by a gap.

18. The method of claim 13, further comprising:
   introducing a fixing medium in the hole before the step of closing.

19. The method of claim 18, further comprising:
   exposing the fixing medium to ultraviolet radiation.

* * * * *